United States Patent
Kanno et al.

(10) Patent No.: US 7,611,779 B2
(45) Date of Patent: Nov. 3, 2009

(54) ORGANIC ELECTROLUMINESCENT DEVICE

(75) Inventors: Hiroshi Kanno, Osaka (JP); Noriyuki Matsusue, Hirakata (JP); Kaori Saito, Moriguchi (JP); Yuji Hamada, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 235 days.

(21) Appl. No.: 10/809,804

(22) Filed: Mar. 26, 2004

(65) Prior Publication Data

US 2005/0074630 A1    Apr. 7, 2005

(30) Foreign Application Priority Data

Mar. 27, 2003   (JP)   ............................. 2003-089415
Mar. 18, 2004   (JP)   ............................. 2004-079216

(51) Int. Cl.
    *H01L 51/54*    (2006.01)

(52) U.S. Cl. .................. 428/690; 428/917; 313/504; 313/506; 257/E51.044

(58) Field of Classification Search ........................ None
    See application file for complete search history.

(56) References Cited

U.S. PATENT DOCUMENTS

| | | | |
|---|---|---|---|
| 6,614,176 B2 | 9/2003 | Kim et al. | |
| 7,291,405 B2 * | 11/2007 | Igarashi et al. | 428/690 |
| 2001/0053462 A1 * | 12/2001 | Mishima | 428/690 |
| 2002/0125818 A1 | 9/2002 | Sato et al. | |
| 2003/0152802 A1 | 8/2003 | Tsuboyama et al. | |
| 2003/0218418 A9 | 11/2003 | Sato et al. | |

FOREIGN PATENT DOCUMENTS

| | | |
|---|---|---|
| EP | 1 154 498 A2 | 11/2001 |
| EP | 1 371 708 A1 | 12/2003 |
| EP | 1 399 002 A1 | 3/2004 |
| JP | 2000-277258 A | 10/2000 |
| JP | 2001-93667 A | 4/2001 |
| JP | 2001-313180 A | 11/2001 |
| JP | 2002-33191 A | 1/2002 |
| JP | 2003-68466 A | 3/2003 |
| JP | 2003-73388 A | 3/2003 |
| JP | 2003-77674 A | 3/2003 |
| WO | WO 02/064700 A1 | 8/2002 |

OTHER PUBLICATIONS

Kido, J. et al. "Multilayer White Light-Emitting Organic Electroluminescent Device," Science, vol. 267, Mar. 3, 1995, Department of Materials Science and Engineering, Yamagata University, Yonezawa, Yamagata 992, Japan, pp. 1332-1334.

Office Action issued in corresponding Japanese Patent Application No. 2004-079216, dated Sep. 7, 2004.

* cited by examiner

*Primary Examiner*—Marie R. Yamnitzky
(74) *Attorney, Agent, or Firm*—McDermott Will & Emery LLP

(57) ABSTRACT

A hole injection layer, a hole transport layer, a blue light emitting layer, an orange light emitting layer, an electron transport layer, an electron injection layer, and a cathode are formed in this order on an anode. The blue light emitting layer is composed of a host material doped with an assisting dopant and a luminescent dopant emitting blue light. A material used for the hole transport layer is used for the assisting dopant. The orange light emitting layer is composed of a host material doped with a luminescent dopant emitting orange light.

4 Claims, 5 Drawing Sheets

F I G. 1
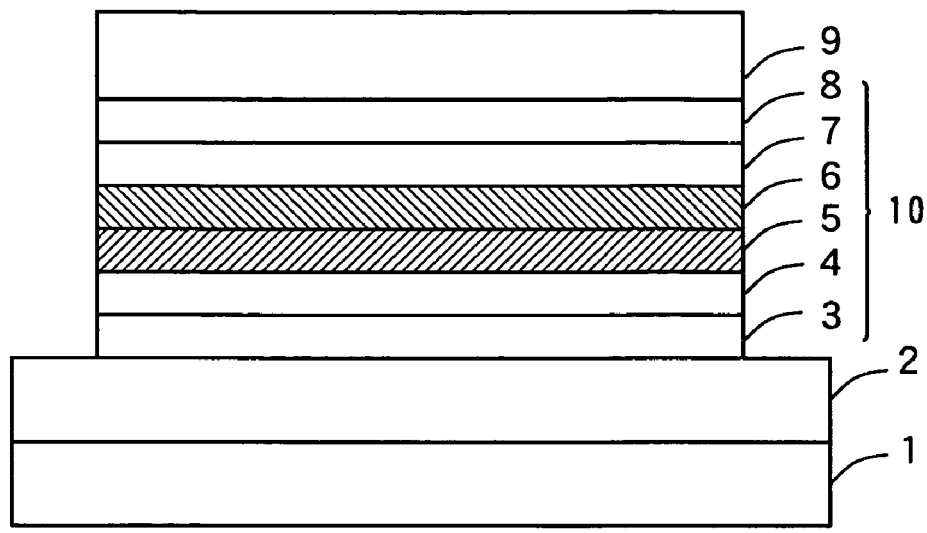
F I G. 2
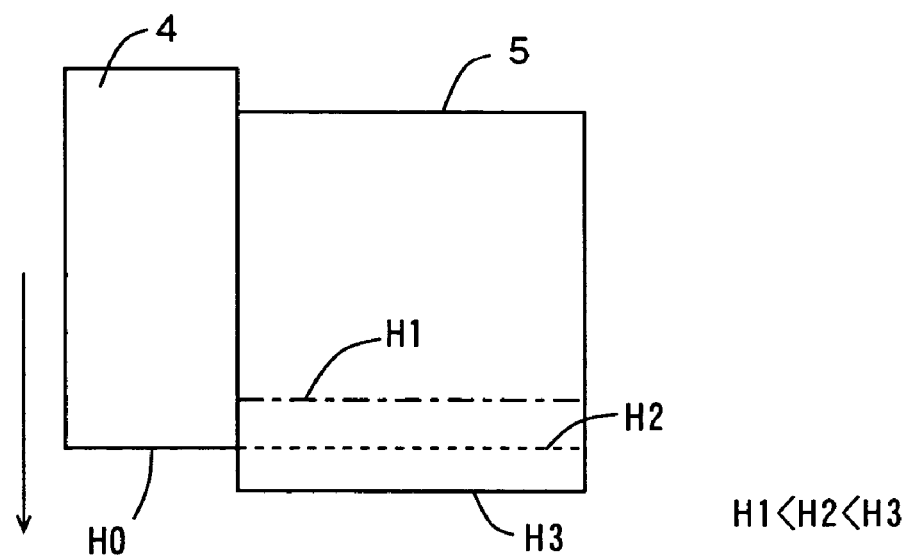
H1<H2<H3

$H4 < H5 < H6$
$|H6 - H5| < 0.4 eV$
$|H5 - H4| < 0.4 eV$

ORGANIC ELECTROLUMINESCENT DEVICE

BACKGROUND OF THE INVENTION

1. Field of the Invention

The present invention relates to an organic electroluminescent device (hereinafter referred to as an organic EL device).

2. Description of the Background Art

In recent years, with the prosperity of information technology (IT), demands for thin type display devices that are of a thin type having a thickness of several millimeters and can perform full-color display have increased. As such thin type display devices, the development of organic EL devices has been advanced.

Examples of methods of realizing full-color display include a method using a red light emitting device, a green light emitting device, and a blue light emitting device (see JP-A-2001-93667, for example) and a method using a combination of a white light emitting device and color filters for transmitting monochromatic lights in the three primary colors. The white light emitting device includes a blue luminescent material and an orange luminescent material, to realize a white color by simultaneously emitting blue light emitted by the blue luminescent material and orange light emitted by the orange luminescent material.

When white luminescence is realized using the blue luminescent material and the orange luminescent material, however, high efficiency as a white color cannot be realized unless the blue light and the orange light are emitted at a high efficiency. In a conventional white light emitting device, the limit is a luminous efficiency of 10 cd/A (see J. kido, M. Kumura, K. Nagai, Science, 267, 1332, 1995, for example).

On the other hand, when a white light emitting device and color filters are combined to perform full-color display, a part of white light is absorbed by the color filters, so that light having a high luminance is not obtained. In a case where the white light emitting device and the color filters are combined to perform full-color display, therefore, the power consumption is higher and the luminance is lower, as compared with those in a case where the red light emitting device, the green light emitting device, and the blue light emitting device are used to perform full-color display.

SUMMARY OF THE INVENTION

An object of the present invention is to provide an organic electroluminescent device that can emit white light outward at a high efficiency.

An organic electroluminescent device according to the present invention comprises a first electrode, a light emitting layer, and a second electrode in this order, the light emitting layer comprising two or more types of different luminescent materials, and at least one of the two or more types of different luminescent materials being a phosphorescent material.

In the organic electroluminescent device according to the present invention, holes are supplied from one of the first and second electrodes to the light emitting layer, and electrons are supplied from the other one of the first and second electrodes to the light emitting layer. Consequently, the two or more types of difference luminescent materials contained in the light emitting layer respectively emit lights. In this case, one or more of the lights are phosphorescence. Therefore, the light emitting layer emit light having a high intensity. As a result, white light can be emitted outward at a high efficiency.

The light emitting layer may comprise a short wavelength light emitting layer and a long wavelength light emitting layer. At least one of the peak wavelengths of light emitted by the short wavelength light emitting layer may be in a range of 430 nm to 520 nm, and at least one of the peak wavelengths of light emitted by the long wavelength light emitting layer may be in a range of 520 nm to 630 nm.

In this case, the short wavelength light emitting layer mainly emits blue light, and the long wavelength light emitting layer mainly emits orange light. Consequently, white light can be emitted outward at a high efficiency.

The long wavelength light emitting layer may further contain a first host material and a first phosphorescent material. The first phosphorescent material may have a molecular structure expressed by the following formula (A1). In the formula (A1), A may be a substituent, R1 and R2 may be the same or different from each other, and may be each a hydrogen atom, a halogen atom, or a substituent, L may be a substituent, M may be a heavy metal, m may be 1, 2, or 3, and m and n may satisfy a relationship of $2m+2n=6$ or $2m+n=6$.

In this case, the long wavelength light emitting layer emits orange light having a high intensity. Consequently, white light can be emitted outward at a high efficiency.

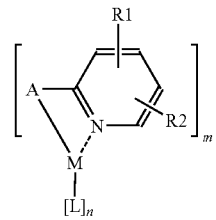

(A1)

The R1 may be a hydrogen atom, the R2 may have a molecular structure expressed by the following formula (A2), and R3 in the formula (A2) may be a hydrogen atom, a halogen atom, or a substituent.

In this case, the long wavelength light emitting layer emits orange light having a high intensity. Consequently, white light can be emitted outward at a high efficiency.

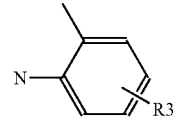

(A2)

The A may have a molecular structure expressed by the following formula (A3), and R4 in the formula (A3) may be a hydrogen atom, a halogen atom, or a substituent.

In this case, the long wavelength light emitting layer emits orange light having a high intensity. Consequently, white light can be emitted outward at a high efficiency.

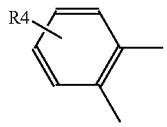

(A3)

The first phosphorescent material may have a Tris(2-phenylquinoline)iridium skeleton having a molecular structure expressed by the following formula (A4), and R5 and R6 in the formula (A4) may be the same or different from each other, and may be each a hydrogen atom, a halogen atom, or a substituent.

In this case, the long wavelength light emitting layer emits orange light having a high intensity. Consequently, white light can be emitted outward at a high efficiency.

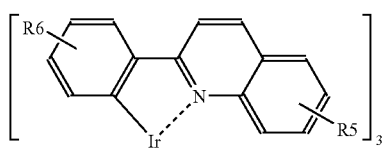

(A4)

The first electrode may be an anode, and the second electrode maybe a cathode. The long wavelength light emitting layer and the short wavelength light emitting layer may be formed in this order between the anode and the cathode, and the long wavelength light emitting layer may further contain a first assisting dopant having a hole transport capability.

In this case, holes supplied from the anode to the long wavelength light emitting layer easily pass through the long wavelength light emitting layer. Consequently, the supplied holes and electrons supplied from the cathode to the short wavelength light emitting layer are easily recombined with each other in the short wavelength light emitting layer. Therefore, recombination of almost all of the holes supplied from the anode to the long wavelength light emitting layer with the electrons in the long wavelength light emitting layer is prevented, thereby preventing the luminous intensity of the orange light emitted by the long wavelength light emitting layer from being higher than the luminous intensity of the blue light emitted by the short wavelength light emitting layer.

The volume ratio of the sum of the first phosphorescent material and the first assisting dopant to the long wavelength light emitting layer may be 3 to 40%. In this case, the holes supplied from the anode to the long wavelength light emitting layer easily pass through the long wavelength light emitting layer. Therefore, the supplied holes and electrons are easily recombined with each other in the short wavelength light emitting layer.

The energy level H6 of the highest occupied molecular orbit of the first host material, the energy level H4 of the highest occupied molecular orbit of the first phosphorescent material, and the energy level H5 of the highest occupied molecular orbit of the first assisting dopant may satisfy relationships given by the following expressions (5) to (7):

$$H4 < H5 < H6 \quad (5)$$

$$|H6 - H5| < 0.4 \text{ eV} \quad (6)$$

$$|H5 - H4| < 0.4 \text{ eV} \quad (7)$$

In this case, the holes supplied from the anode to the long wavelength light emitting layer easily pass through the long wavelength light emitting layer. Therefore, the supplied holes and electrons are easily recombined with each other in the short wavelength light emitting layer.

The first assisting dopant may be composed of an amine-based material, an anthracene derivative, or an iridium complex. In this case, the holes supplied from the anode to the long wavelength light emitting layer easily pass through the long wavelength light emitting layer. Therefore, the supplied holes and electrons are easily recombined with each other in the short wavelength light emitting layer.

The ratio of the maximum peak luminous intensity of the light emitted by the long wavelength light emitting layer to the maximum peak luminous intensity of the light emitted by the short wavelength light emitting layer may be 100:20 to 100:100. In this case, the intensity of the orange light and the intensity of the blue light are approximately the same. Consequently, white light can be emitted outward at a high efficiency.

The first electrode may be an anode, and the second electrode may be a cathode. The long wavelength light emitting layer and the short wavelength light emitting layer may be formed in this order between the anode and the cathode, the short wavelength light emitting layer may further contain a second host material and an assisting dopant, and the assisting dopant may be composed of the same material as the first host material.

In this case, the assisting dopant in the short wavelength light emitting layer is composed of the same material as the first host material in the long wavelength light emitting layer, thereby increasing the amount of injection of holes into the short wavelength light emitting layer. Therefore, the luminous intensity of the short wavelength light emitting layer is improved.

The short wavelength light emitting layer may contain a second phosphorescent material. In this case, the short wavelength light emitting layer emits light having a high intensity.

The short wavelength light emitting layer may contain a second host material and a second phosphorescent material. The second phosphorescent material may have a molecular structure expressed by the following formula (B1). In the formula (B1), A may be a substituent, R10 may be a hydrogen atom, a halogen atom, or a substituent, L may be a substituent, M may be a heavy metal, m may be 1, 2, or 3, and m and n may satisfy a relationship of 2m+2n=6 or 2m+n=6.

In this case, the short wavelength light emitting layer emits blue light having a high intensity. Consequently, white light can be emitted outward at a high efficiency.

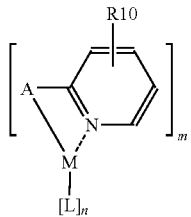

(B1)

The A may have a molecular structure expressed by the following formula (B2), and R11 in the formula (B2) may be a hydrogen atom, a halogen atom, or a substituent.

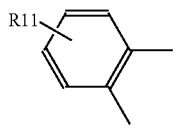

(B2)

In this case, the short wavelength light emitting layer emits blue light having a high intensity. Consequently, white light can be emitted outward at a high efficiency.

The first electrode may be an anode, and the second electrode may be a cathode. The short wavelength light emitting layer and the long wavelength light emitting layer may be formed in this order between the anode and the cathode, and the short wavelength light emitting layer may further contain a second assisting dopant having a hole transport capability.

In this case, holes supplied from the anode to the short wavelength light emitting layer easily pass through the short wavelength light emitting layer. Consequently, the supplied holes and electrons supplied from the cathode to the long wavelength light emitting layer are easily recombined with each other in the long wavelength light emitting layer. Therefore, recombination of almost all of the holes supplied from the anode to the short wavelength light emitting layer with the electrons in the short wavelength light emitting layer is prevented, thereby preventing the luminous intensity of the blue light emitted by the short wavelength light emitting layer from being higher than the luminous intensity of the orange light emitted by the long wavelength light emitting layer.

The volume ratio of the sum of the second phosphorescent material and the second assisting dopant to the short wavelength light emitting layer may be 3 to 40%. In this case, the holes supplied from the anode to the short wavelength light emitting layer easily pass through the short wavelength light emitting layer. Therefore, the supplied holes and electrons are easily recombined with each other in the long wavelength light emitting layer.

The energy level H3 of the highest occupied molecular orbit of the second host material, the energy level H1 of the highest occupied molecular orbit of the second phosphorescent material, and the energy level H2 of the highest occupied molecular orbit of the second assisting dopant may satisfy a relationship given by the following expression (9).

$$H1 < H2 < H3 \tag{9}$$

In this case, the holes supplied from the anode to the short wavelength light emitting layer easily pass through the short wavelength light emitting layer. Therefore, the supplied holes and electrons are easily recombined with each other in the long wavelength light emitting layer.

The second assisting dopant may be composed of an amine-based material, an anthracene derivative, or an iridium complex. In this case, the holes supplied from the anode to the short wavelength light emitting layer easily pass through the short wavelength light emitting layer. Therefore, the supplied holes and electrons are easily recombined with each other in the long wavelength light emitting layer.

The ratio of the maximum peak luminous intensity of the light emitted by the short wavelength light emitting layer to the maximum peak luminous intensity of the light emitted by the long wavelength light emitting layer may be 100:20 to 100:100. In this case, the intensity of the blue light and the intensity of the orange light are approximately the same. Consequently, white light can be emitted outward at a high efficiency.

The first electrode may be an anode, and the second electrode may be a cathode. The short wavelength light emitting layer and the long wavelength light emitting layer may be formed in this order between the anode and the cathode, the long wavelength light emitting layer may further contain a first host material, the short wavelength light emitting layer may further contain a second host material and an assisting dopant, and the assisting dopant may be composed of the same material as the first host material.

In this case, the assisting dopant in the short wavelength light emitting layer is composed of the same material as the first host material in the long wavelength light emitting layer, thereby increasing the amount of injection of electrons into the short wavelength light emitting layer. Therefore, the luminous intensity of the short wavelength light emitting layer is improved.

The long wavelength light emitting layer may contain a first host material and a first phosphorescent material, the short wavelength light emitting layer may contain a second host material, a second phosphorescent material, and an assisting dopant, and the assisting dopant may be composed of the same material as the first host material.

In this case, the assisting dopant in the short wavelength light emitting layer is composed of the same material as the first host material in the long wavelength light emitting layer, thereby increasing the amount of injection of holes or electrons into the short wavelength light emitting layer. Therefore, the luminous intensity of the short wavelength light emitting layer is improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic sectional view showing an organic EL device according to a first embodiment of the present invention;

FIG. 2 is a diagram showing the energy levels of the lowest unoccupied molecular orbit (LUMO) and the highest occupied molecular orbit (HOMO) of each of a hole transport layer, a blue light emitting layer, a host material, a luminescent dopant, and an assisting dopant in the organic EL device according to the first embodiment;

DESCRIPTION OF THE PREFERRED EMBODIMENTS

First Embodiment

Figure 3:
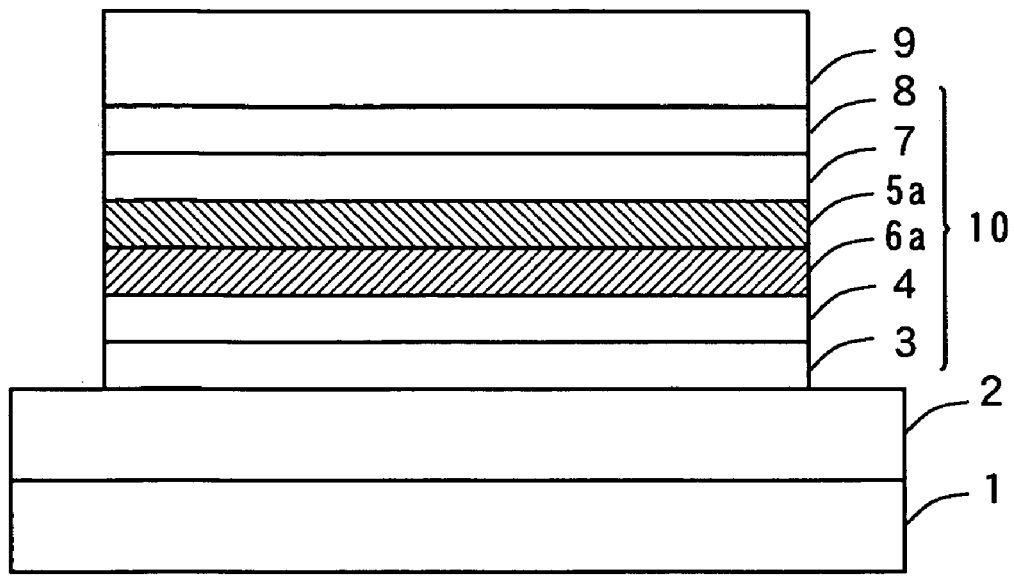
FIG. 3 is a schematic sectional view showing an organic EL device according to a second embodiment.

FIG. 1 is a schematic sectional view showing an organic EL device according to a first embodiment of the present invention.

In fabrication of an organic EL device 100 shown in FIG. 1, an anode 2 composed of $In_2O_3$—$SnO_2$ (ITO) is previously formed on a glass substrate 1, and a hole injection layer 3, a hole transport layer 4, a blue light emitting layer 5, an orange light emitting layer 6, an electron transport layer 7, and an electron injection layer 8 are formed in this order by a vapor deposition at a vacuum in the $10^{-4}$ Pa order, to form an organic thin film layer 10. Further, a cathode 9 composed of an alloy of magnesium and indium (Mg:In) is formed on the organic thin film layer 10.

The hole transport layer 4 is composed of an amine-based material such as N,N'-Di(naphthalene-1-yl)-N,N'-diphenyl-benzidine (hereinafter referred to as NPB) having a molecular structure expressed by the following formula (D1), 4,4'4"-Tris(N-(2-naphthyl)-N-phenyl-amino)-triphenylamine (hereinafter referred to as 2TNATA) having a molecular structure expressed by the following formula (D2), and N,N'-Bis-(3-methylphenyl)-N,N'-bis-(phenyl)-benzidine (hereinafter referred to as TPD), for example:

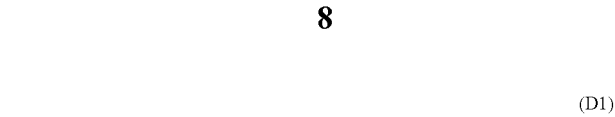

(D1)

(D-2)

The hole transport layer 4 may be composed of an anthracene derivative such as Rubrene having a molecular structure expressed by the following formula (D3) or Tris(2-phenylpyridine)iridium (hereinafter referred to as Ir(ppy)) having a molecular structure expressed by the following formula (D4):

(D3)

(D4)

The blue light emitting layer 5 is composed of a host material doped with a luminescent dopant and an assisting dopant.

The host material composing the blue light emitting layer 5 is composed of tert-butyl substituted di-naphthyl anthracene (hereinafter referred to as a compound A) having a molecular structure expressed by the following formula (C1), for example:

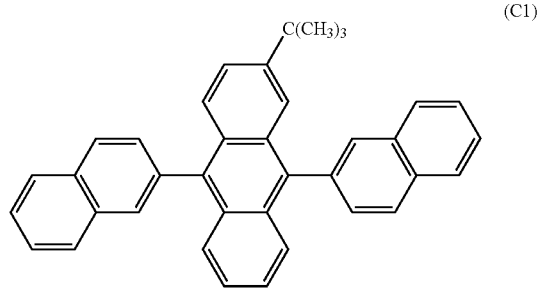
(C1)

It is preferable that the luminescent dopant (a phosphorescent material) to be doped into the host material composing the blue light emitting layer 5 has a molecular structure expressed by the following formula (B1). In the formula (B1), R10 is a hydrogen atom, a halogen atom, or a substituent, A is a substituent, L is a ligand, and M is a heavy metal.

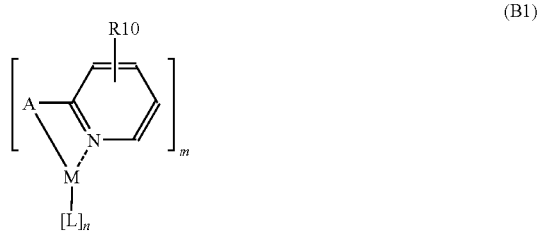
(B1)

Examples of the substituent R10 are a cyano group, a silyl group, an alkynyl group, an alkenyl group, an alkoxy group, a hydroxy group, an amino group, a nitro group, a nitrile group, a sulfo group, a carboxy group, an alldehyde group, or the like, which is saturated or unsaturated straight-chain or branched chain having a maximum of 20 carbon atoms.

Alternative examples of the substituent R10 are an aryl group, a heteroaromatic group, a condensed aromatic group, or the like, which is condensed with a pyridine ring. The groups each have an alkyl group, an alkenyl group, an acyclo alkyl group, an aryl group, or the like. The aryl group is a phenyl group or a hetero aryl group, for example, the hetero atom may have an oxygen atom, a sulfur atom, or a nitrogen atom, and/or a substituent selected from a halogen atom, a hydroxy group, an amino group, a sulfo group, a phospho group, a carboxy group, an aldehyde group, and the like.

The heavy metal M in the foregoing formula (B1) may be platinum, palladium, iridium, rhodium, rhenium, or the like. m and n in the foregoing formula (B1) satisfy a relationship of 2m+2n=6 or 2m+n=6 (m=1, 2, 3). L is a single-seated or double-seated ligand with respect to M.

The substituent A in the foregoing formula (B1) may be expressed by the following formula (B2):

(B2)

R11 in the foregoing formula (B2) is a hydrogen atom, a halogen atom, or a substituent. Examples of the substituent R11 may be $-C_nH_{2n+1}$ (n=0-10), a phenyl group, a naphthyl group, a thiophene group, $-CN$, $-N(C_nH_{2n+1})_2$ (n=1-10), $-COOC_nH_{2n+1}$ (n=1-10), $-F$, $-Cl$, $-Br$, $-I$, $-OCH_3$, $-OC_2H_5$, or the like.

The compound expressed by the foregoing formula (B1) may be Bis(2-(2,4-difluorophenyl)pyridine) (picolinic acid) iridium (referred to as FIrpic) having a molecular structure expressed by the following formula (B3):

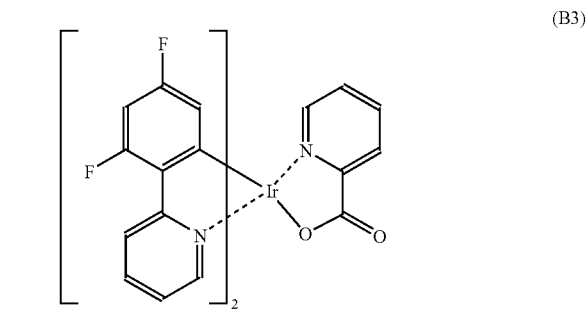
(B3)

The compound expressed by the foregoing formula (B1) may be Bis(2-(2,4,5-trifluorophenyl)pyridine) (picolinic acid) iridium (referred to as Ir(2,4,5-Fppy)$_2$(pic)) having a molecular structure expressed by the following formula (B4):

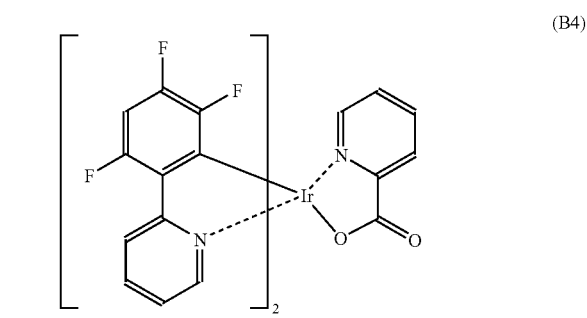
(B4)

The compound expressed by the foregoing formula (B1) may be Tris(2-(5-trifluoromethylphenyl)pyridine) iridium (referred to as Ir(5-CF$_3$ppy)$_3$) having a molecular structure expressed by the following formula (B5):

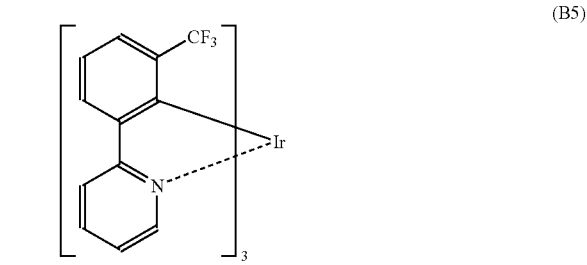
(B5)

The compound expressed by the foregoing formula (B1) may be Tris(2-(4-trifluoromethylphenyl)-5-trifluoromethylpyridine) iridium (referred to as Ir(4,5'-CF$_3$ppy)$_3$) having a molecular structure expressed by the following formula (B6):

(B6)

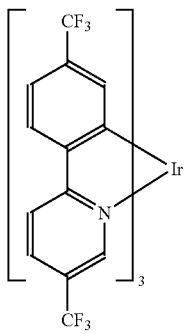

Furthermore, the luminescent dopant (fluororescent material) to be doped into the host material composing the blue light emitting layer 5 may have a molecular structure expressed by the following formula (B7):

(B7)

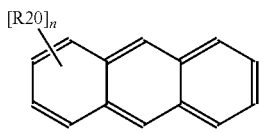

In the formula (B7), R20 represents a substituent, described later, and n is an integer 1 through 10. When n is not less than two, the substituents R20 may be the same or different. R20 is an aryl group such as a phenyl group or a hetero aryl group, for example, the hetero atom may have an oxygen atom, a sulfur atom, or a nitrogen atom and/or a halogen atom, may have a substituent selected from a hydroxy group, an amino group, a sulfo group, a phospho group, a carboxy group, an aldehyde group, a carbazole group, or the like, or may have an oxygen atom, a sulfur atom, or a nitrogen atom and/or a halogen atom and the above-mentioned substituent. Further, R20 may be substituted for any cite of the anthracene ring, or a plurality of R20 may be substituted for the anthracene ring. R20 may be a plurality of substituents which differ from one another.

The peak wavelength of the intensity of light emitted by the luminescent dopant is 430 nm to 510 nm. Therefore, the blue light emitting layer 5 mainly emits blue light.

An example of the luminescent dopant (fluorescent material) to be doped into the host material composing the blue light emitting layer 5 is 1,4,7,10-Tetra-tert-butylPerylene (hereinafter referred to as TBP) having a molecular structure expressed by the following formula (B8):

(B8)

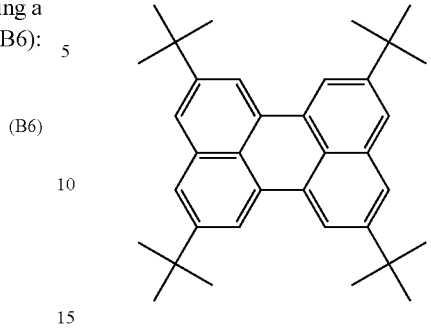

An example of the assisting dopant to be doped into the host material composing the blue light emitting layer 5 is NPB or Rubrene used for the hole transport layer 4.

In the blue light emitting layer 5, the volume ratio of the luminescent dopant to the host material is approximately 2%, and the volume ratio of the assisting dopant thereto is 0% to 40%, for example. The volume ratio of the assisting dopant is preferably 3% to 40%.

The orange light emitting layer 6 is composed of a host material doped with a luminescent dopant.

The host material composing the orange light emitting layer 6 is composed of 4,4'-Bis(carbazol-9-yl)-biphenyl (hereinafter referred to as CBP) having a molecular structure expressed by the following formula (C2), for example:

(C2)

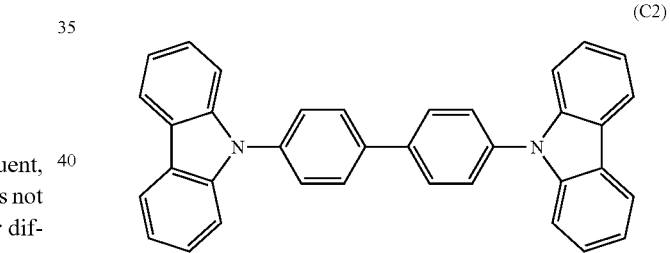

It is preferable that the luminescent dopant to be doped into the host material composing the orange light emitting layer 6 has a molecular structure expressed by the following formula (A1). In the formula (A1), R1 and R2 are the same or different from each other, and are each a hydrogen atom, a halogen atom, or a substituent, A is a substituent, L is a ligand, and M is a heavy metal.

(A1)

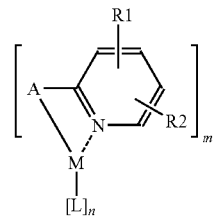

Examples of the substituents R1 and R2 are a cyano group, a silyl group, an alkynyl group, an alkenyl group, an alkoxy group, a hydroxy group, an amino group, a nitro group, a nitrile group, a sulfo group, a carboxy group, an aldehyde group, or the like, which is saturated or unsaturated straight-chain or branched chain having a maximum of 20 carbon atoms.

Alternative examples of the substituents R1 and R2 are an aryl group, a heteroaromatic group, a condensed aromatic group, or the like which is condensed with a pyridine ring. The groups each have an alkyl group, an alkenyl group, an acyclo alkyl group, an aryl group, or the like. The aryl group is a phenyl group or a hetero aryl group, for example, the hetero atom may have an oxygen atom, a sulfur atom, or a nitrogen atom, and/or a substituent selected from a halogen atom, a hydroxy group, an amino group, a sulfo group, a phospho group, a carboxy group, an aldehyde group, and the like. R1 and R2 may be combined with each other or cyclized.

In the foregoing formula (A1), R1 may be a hydrogen atom, and R2 may be a substituent expressed by the following formula (A2). R3 in the following formula (A2) is a hydrogen atom, a halogen atom, or a substituent.

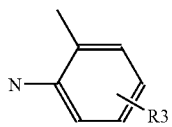

(A2)

Each of the substituent R3 may be —$C_nH_{2n+1}$ (n=0-10), a phenyl group, a naphthyl group, a thiophene group, —CN, —$N(C_nH_{2n+1})_2$ (n=1-10), —$COOC_nH_{2n+1}$ (n=1-10), —F, —Cl, —Br, —I, —$OCH_3$, —$OC_2H_5$, or the like.

Examples of the ligand L in the foregoing formula (A1) may be a halogen ligand, a carboxylic acid ligand such as picolinic acid or salicylic acid, an imine ligand, a diketone ligand such as acetylacetone or dibenzoylmethane, a phosphorous ligand, an ortho carbometallation ligand such as phenyl pyridine, etc.

The heavy metal M in the foregoing formula (A1) may be platinum, palladium, iridium, rhodium, rhenium, or the like.

m and n in the foregoing formula (A1) satisfy a relationship of 2m+2n=6 or 2m+n=6 (m=1, 2, 3). L is a single-seated or double-seated ligand with respect to M.

The substituent A in the foregoing formula (A1) may be expressed by the following formula (A3):

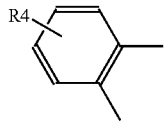

(A3)

R4 in the foregoing formula (A3) is a hydrogen atom, a halogen atom, or a substituent. Examples of the substituent R4 may be —$C_nH_{2n+1}$ (n=0-10), a phenyl group, a naphthyl group, a thiophene group, —CN, —$N(C_nH_{2n+1})_2$ (n=1-10), —$COOC_nH_{2n+1}$ (n=1-10), —F, —Cl, —Br, —I, —$OCH_3$, —$OC_2H_5$, or the like.

The compound expressed by the foregoing formula (A1) may have a Tris(2-phenylquinoline)iridium (hereinafter referred to as Ir(phq)) skeleton having a molecular structure expressed by the following formula (A4):

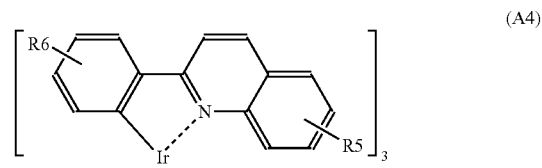

(A4)

R5 and R6 in the foregoing formula (A4) are each a halogen atom or a substituent. Examples of the substituents R5 and R6 may be each —$C_nH_{2n+1}$ (n=0-10), a phenyl group, a naphthyl group, a thiophene group, —CN, —$N(C_nH_{2n+1})_2$ (n=1-10), —$COOC_nH_{2n+1}$ (n=1-10) —F, —Cl, —Br, —I, —$OCH_3$, —$OC_2H_5$, or the like.

The compound expressed by the foregoing formula (A1) may be Tris(2-phenylquinoline)iridium (hereinafter referred to as Ir(phq)) having a molecular structure expressed by the following formula (A5):

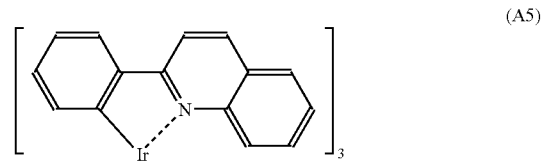

(A5)

The compound expressed by the foregoing formula (A1) may be Tris(2-naphthylquinoline)iridium (hereinafter referred to as Ir(Naphq)) having a molecular structure expressed by the following formula (A6):

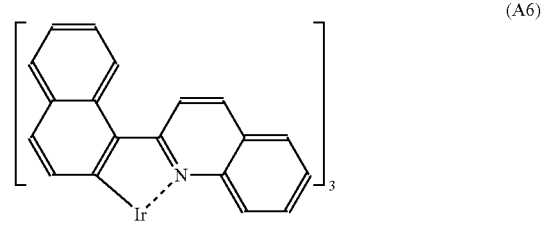

(A6)

The peak wavelength of the intensity of light emitted by the luminescent dopant is 520 nm to 680 nm. Therefore, the orange light emitting layer 6 mainly emits orange light. In the orange light emitting layer 6, the ratio of the thickness corresponding to the luminescent dopant to the thickness corresponding to the host material is approximately 6.5%.

FIG. 2 is a diagram showing the energy levels of the lowest unoccupied molecular orbit (LUMO) and the highest occupied molecular orbit (HOMO) of each of the hole transport layer 4, the blue light emitting layer 5, the host material, the lulminescent dopant, and the assisting dopant in the organic EL device according to the first embodiment.

As described in FIG. 1, the hole transport layer 4 and the assisting dopant use the same material. Accordingly, the HOMO level H0 of the hole transport layer 4 and the HOMO level H2 of the assisting dopant are the same energy level.

As shown in FIG. 2, in the blue light emitting layer 5, a relationship of (the HOMO level H1 of the luminescent dopant)<(the HOMO level H2 of the assisting dopant)<(the HOMO level H3 of the host material) holds. The energy of holes increases along an arrow.

Therefore, holes supplied from the hole transport layer 4 to the blue light emitting layer 5 easily pass through the blue light emitting layer 5 to easily reach the orange light emitting layer 6 shown in FIG. 1. As a result, electrons and holes are easily recombined with each other in the orange light emitting layer 6, so that the intensity of light emitted by the orange light emitting layer 6 is increased. Consequently, recombination of almost all of the holes supplied from the hole transport layer 4 to the blue light emitting layer 5 with electrons in the blue light emitting layer 5 is prevented, thereby preventing the luminous intensity of the blue light emitted by the blue light emitting layer 5 from being higher than the luminous intensity of the orange light emitted by the orange light emitting layer 6.

In this case, the ratio of the intensity of the blue light emitted by the blue light emitting layer 5 to the intensity of the orange light emitted by the orange light emitting layer 6 is 100:20 to 100:100.Consequently, the organic EL device shown in FIG. 1 can efficiently emit white light The same material as the host material composing the orange light emitting layer 6 may be used as the assisting dopant to be doped into the host material composing the blue light emitting layer 5. An example of the assisting dopant to be doped into the host material composing the blue light emitting layer 5 is CBP. Therefore, the amount of injection of the electrons into the blue light emitting layer 5 is increased, thereby improving the luminous intensity of the blue light emitted by the blue light emitting layer 5.

In the present embodiment, the blue light emitting layer 5 corresponds to a short wavelength light emitting layer, the orange light emitting layer 6 corresponds to a long wavelength light emitting layer, the host material composing the blue light emitting layer 5 corresponds to a first host material, the luminescent dopant to be doped into the host material composing the blue light emitting layer 5 corresponds to a first phosphorescent material, the assisting dopant to be doped into the host material composing the blue light emitting layer 5 corresponds to a first assisting dopant, the host material composing the orange light emitting layer 6 corresponds to a second host material, the luminescent dopant to be doped into the host material composing the orange light emitting layer 6 corresponds to a second phosphorescent material, and the assisting dopant to be doped into the host material composing the orange light emitting layer 6 corresponds to a second assisting dopant.

Second Embodiment

FIG. 3 is a schematic sectional view showing an organic EL device according to a second embodiment.

The organic EL device shown in FIG. 3 differs from the organic EL device shown in FIG. 1 in that a blue light emitting layer 5a and an orange light emitting layer 6a shown in FIG. 3 are formed in an order reverse to the blue light emitting layer 5 and the orange light emitting layer 6 shown in FIG. 1.

The orange light emitting layer 6a has a structure in which the assisting dopant is doped into the host material composing the orange light emitting layer 6 shown in FIG. 1. An example of an assisting dopant to be doped into a host material composing the orange light emitting layer 6a is NPB, Rubrene, or Ir(ppy) used for a hole transport layer 4.

In the orange light emitting layer 6a, the volume ratio of a luminescent dopant to the host material is approximately 6.5%, and the volume ratio of the assisting dopant thereto is 0% to 40%, for example. The volume ratio of the assisting dopant is preferably 3% to 40%.

The blue light emitting layer 5a has a structure in which no assisting dopant is doped into the host material composing the blue light emitting layer 5 shown in FIG. 1.

Figure 4:
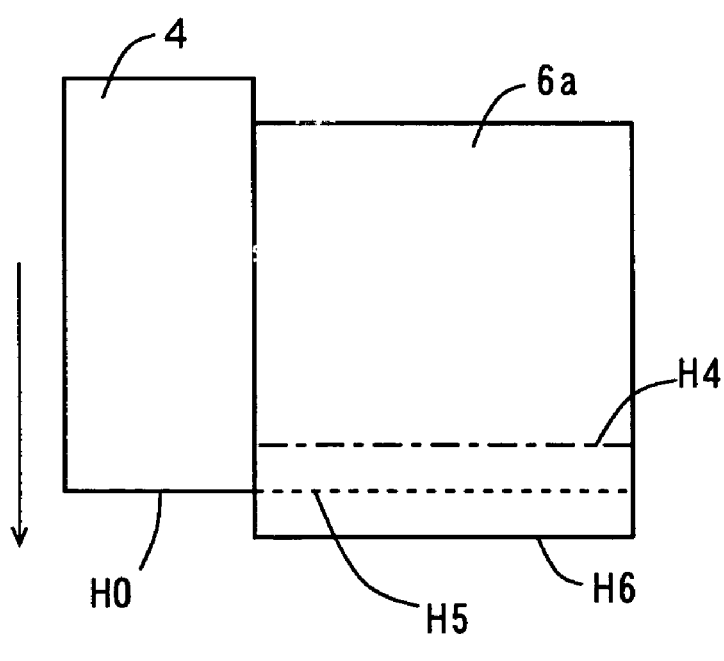
FIG. 4 is a diagram showing the energy levels of the lowest unoccupied molecular orbit (LUMO) and the highest occupied molecular orbit (HOMO) of each of a hole transport layer, an orange light emitting layer, a host material, a luminescent dopant, and an assisting dopant in the organic EL device according to the second embodiment.

FIG. 4 is a diagram showing the energy levels of the lowest unoccupied molecular orbit (LUMO) and the highest occupied molecular orbit (HOMO) of each of the hole transport layer 4, the orange light emitting layer 6a, the host material, the luminescent dopant, and the assisting dopant in the organic EL device according to the second embodiment.

As described in FIG. 3, the hole transport layer 4 and the assisting dopant may use the same material. Accordingly, the HOMO level H0 of the hole transport layer 4 and the HOMO level H5 of the assisting dopant are the same energy level.

As shown in FIG. 4, in the orange light emitting layer 6a, a relationship of (the HOMO level H4 of the luminescent dopant)<(the HOMO level H5 of the assisting dopant)<(the HOMO level H6 of the host material) holds. With respect to each of the HOMO levels, a relationship of |(the HOMO level H6 of the host material)−(the HOMO level H5 of the assisting dopant)|<0.4 eV and a relationship of |(the HOMO level H5 of the assisting dopant)−(the HOMO level H4 of the luminescent dopant)<0.4 eV hold.

Therefore, holes supplied from the hole transport layer 4 to the orange light emitting layer 6a easily pass through the orange light emitting layer 6a to easily reach the blue light emitting layer 5a shown in FIG. 3. As a result, electrons and holes are easily recombined with each other in the blue light emitting layer 5a, so that the intensity of light emitted by the blue light-emitting layer 5a is increased. Consequently, recombination of almost all of the holes supplied from the hole transport layer 4 to the orange light emitting layer 6a with electrons in the orange light emitting layer 6a is prevented, thereby preventing the luminous intensity of orange light emitted by the orange light emitting layer 6a from being higher than the luminous intensity of blue light emitted by the blue light emitting layer 5a.

In this case, the ratio of the intensity of the orange light emitted by the orange light emitting layer 6a to the intensity of the blue light emitted by the blue light emitting layer 5a is 100:20 to 100:100.Consequently, the organic EL device shown in FIG. 3 can efficiently emit white light.

The same material as the host material composing the orange light emitting layer 6a may be used as the assisting dopant to be doped into the host material composing the blue light emitting layer 5a. An example of the assisting dopant to be doped into the host material composing the blue light emitting layer 5a is CBP. Therefore, the amount of injection of the holes into the blue light emitting layer 5a is increased, thereby improving the luminous intensity of the blue light emitted by the blue light emitting layer 5a.

EXAMPLES

In inventive examples 1 to 8, organic electroluminescent devices were prepared by changing the types of host material and dopant used for blue light emitting layers 5 and 5a and orange light emitting layers 6 and 6a and their composition ratios, to examine the effect of the types of host material and dopant and their composition ratios on a luminous efficiency.

Each of the organic EL devices in the inventive examples 1 to 3 and 7 and the comparative example 1 has the structure of the organic EL device according to the first embodiment, where the thickness of the hole injection electrode 3 is 10 nm, the thickness of the hole transport layer 4 is 50 nm, the thickness of the blue light emitting layer 5 is 10 nm, the thickness of the orange light emitting layer 6 is 25 nm, the thickness of the electron transport layer 7 is 20 nm, the thickness of the electron injection layer 8 is 1 nm, and the thickness of the cathode 9 is 200 nm.

Each of the organic EL devices in the inventive examples 4 to 6 and 8 and the comparative example 2 has the structure of the organic EL device according to the second embodiment, where the thickness of the hole injection electrode 3 is 10 nm, the thickness of the hole transport layer 4 is 50 nm, the thickness of the orange light emitting layer 6a is 10 nm, the thickness of the blue light emitting layer 5a is 25 nm, the thickness of the electron transport layer 7 is 20 nm, the thickness of the electron injection layer 8 is 1 nm, and the thickness of the cathode 9 is 200 nm.

Hereinafter, each of the structure of the organic EL device according to the first embodiment is referred to as a structure A, and the structure of the organic EL device according to the second embodiment is referred to as a structure B.

Inventive Example 1

In the inventive example 1, the organic EL device having the structure A was prepared. First, the anode 2 was formed on the glass substrate 1 by 80 nm sputtering. The glass substrate 1 having the anode 2 formed thereon was cleaned with a mild detergent and pure water, and was then baked at a temperature of 100° C. for not less than 10 hours, followed by UV/O3 cleaning, to set the glass substrate 1 in a chamber of a vacuum evaporation system which is depressurized to not more than $1\times10^{-4}$ Pa.

CuPc was formed as the hole injection layer 3, and NPB was formed by vacuum evaporation as the hole transport layer 4. Then, the compound A was used as a host material, and TBP was used as a luminescent dopant, to form the blue light emitting layer 5. TBP was doped such that the volume ratio thereof to the blue light emitting layer 5 was 2%.

Then, CBP was used as the host material, and Ir(phq) was used as the luminescent dopant, to form the orange light emitting layer 6. Ir(phq) was doped such that the volume ratio thereof to the orange light emitting layer 6 was 6.5%.

Tris(8-hydroxyquinolinato)aluninum (hereinafter referred to as Alq) having a molecular structure expressed by the following formula (C3) was then formed as the electron transport layer 7. LiF was formed as the electron transport layer 8, and Al was formed as the cathode 9. The organic EL device was sealed under an atmosphere of a dew point of −80° C. with adhesives using a glass plate coated with a desiccant. The results are shown in Table 1.

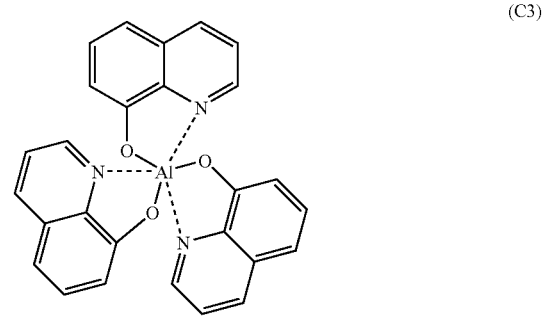

(C3)

TABLE 1

| device structure | blue luminescent layer host material/ luminescent dopant | blue luminescent layer assisting dopant | orange luminescent layer host material/ luminescent dopant | orange luminescent layer assisting dopant | luminescent color (CIE x, y) | luminous efficiency (cd/A at 10 mA/cm²) | ratio of peak luminous intensities of blue luminescent layer/orange luminescent layer | drive voltage (V at 10 mA/cm²) |
|---|---|---|---|---|---|---|---|---|
| inventive example 1 | A | compound A/ TBP | no | CBP/Ir(phq) | no | 0.21, 0.36 | 6.8 | 100/21 | 9 |
| inventive example 2 | A | compound A/ TBP | NPB | CBP/Ir(phq) | no | 0.32, 0.37 | 24.3 | 100/62 | 7.1 |

TABLE 1-continued

| device structure | blue luminescent layer host material/ luminescent dopant | blue luminescent layer assisting dopant | orange luminescent layer host material/ luminescent dopant | orange luminescent layer assisting dopant | luminescent color (CIE x, y) | luminous efficiency (cd/A at 10 mA/cm$^2$) | ratio of peak luminous intensities of blue luminescent layer/orange luminescent layer | drive voltage (V at 10 mA/cm$^2$) |
|---|---|---|---|---|---|---|---|---|
| inventive example 3 | A | compound A/ TBP | rubrene | CBP/Ir(phq) | no | 0.50, 0.42 | 5.1 | 23/100 | 8.2 |
| inventive example 4 | B | compound A/ TBP | no | CBP/Ir(phq) | NPB | 0.41, 0.42 | 22.7 | 59/100 | 7.9 |
| inventive example 5 | B | compound A/ TBP | no | CBP/Ir(phq) | rubrene | 0.50, 0.45 | 13.8 | 21/100 | 8.6 |
| inventive example 6 | B | compound A/ TBP | no | CBP/Ir(phq) | Ir(ppy) | 0.47, 0.43 | 14.0 | 26/100 | 8.2 |
| comparative example 1 | A | compound A/ TBP | no | Alq/DCJTB | no | 0.21, 0.34 | 2.3 | 100/8 | 8.1 |
| comparative example 2 | B | compound A/ TBP | no | CBP/Ir(phq) | no | 0.55, 0.41 | 19.8 | 16/100 | 10.4 |

Inventive Example 2

In the inventive example 2, the organic EL device was prepared in the same method as that in the inventive example 1 except that TBP was doped into the compound A, and NBP was doped thereinto as the assisting dopant, and TBP and NPB were doped such that the volume ratios thereof to the blue light emitting layer 5 were respectively 2% and 10%. The results are shown in Table 1

Inventive Example 3

In the inventive example 3, the organic EL device was prepared in the same method as that in the inventive example 2 except that TBP and Rubrene were doped into the compound A instead of doping TBP and NPB thereinto, and TBP and Rubrene were doped such that the volume ratios thereof to the blue light emitting layer 5 were respectively 2% and 10%. The results are shown in Table 1.

Inventive Example 4

In the inventive example 4, the organic EL device having the structure B was prepared in the same method as that in the inventive example 1 except for the following. That is, after the hole transport layer 4 was formed, CBP was used as a host material, Ir(phq) was used as a luminescent dopant, and NPB was used as an assisting dopant, to form the orange light emitting layer 6a.Ir(phq) and NPB were doped such that the volume ratios thereof to the orange light emitting layer 6a were respectively 6.5% and 10%.

After the orange light emitting layer 6a was formed, the compound A was used as a host material, and TBP was used as a luminescent dopant, to form the blue light emitting layer 5a.TBP was doped such that the volume ratio thereof to the blue light emitting layer 5a was 2.0%. The results are shown in Table 1.

Inventive Example 5

In the inventive example 5, the organic EL device was prepared in the same method as that in the inventive example 4 except that Ir(phq) and Rubrene were doped into CBP instead of doping Ir(phq) and NPB thereinto, and Ir(phq) and Rubrene were doped such that the volume ratios thereof to the orange light emitting layer 6a were respectively 6.5% and 10%.

Inventive Example 6

In the inventive example 6, the organic EL device was prepared in the same method as that in the inventive example 4 except that Ir(phq) and Ir(ppy) were doped into CBP instead of doping Ir(phq) and NPB thereinto, and Ir(phq) and Ir(ppy) were doped such that the volume ratios thereof to the orange light emitting layer 6a were respectively 6.5% and 2%.

Comparative Example 1

In the comparative example 1, the organic EL device was prepared in the same method as that in the inventive example 1 except that (2-(1,1-Dimethylethyl)-6-(2-(2,3,6,7-tetrahydro-1,1,7,7-tetramethyl-lII,5II-benzo[ij]quinolizin-9-yl) ethenyl)-4H-pyran-4-ylidene) propanedinitrile (hereinafter referred to as DCJTB) having a molecular structure expressed by the following formula (D5) was doped into Alq using as a host instead of doping Ir(phq) into CBP, and DCJTB was doped such that the volume ratio thereof to the orange light emitting layer 6 was 1.0%:

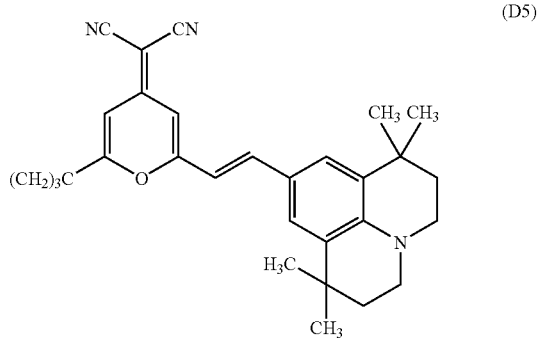

(D5)

Comparative Example 2

In the comparative example 2, the organic EL device was prepared in the same method as that in the inventive example 4 except that NPB was not doped into the host material. The results are shown in Table 1.

(Evaluation 1)

The luminescent properties of each of the organic EL devices prepared in the inventive examples 1 to 6 and the comparative examples 1 and 2 were measured. Table 1 shows the structure, a material for each of layers, and the results of measurement of the luminescent properties of each of the organic EL devices prepared in the inventive examples 1 to 6 and the comparative examples 1 and 2.

In each of the organic EL devices prepared in the inventive examples 1 to 6, Ir(phq) was doped into the organic light emitting layer 6 or 6a, so that the luminous efficiency thereof was not less than two times that in the comparative example 1. Particularly in the inventive examples 2 and 4, the luminous efficiency was significantly improved.

In each of the organic EL devices prepared in the inventive examples 1 to 6, the ratio of the peak intensity of blue light to the peak intensity of orange light is improved. In each of the comparative examples 1 and 2, either one of the peak intensity of blue light and the peak intensity of orange light is excessively high. By comparison, in each of the organic EL devices in the inventive examples 2 to 6, the ratio of the peak intensity of blue light to the peak intensity of orange light is smoothed. The reason for this is that by doping the assisting dopant into the blue light emitting layer 5 or the orange light emitting layer 6a, holes easily passed through the layer, and the position where electrons and holes are combined with each other was changed.

Figure 5:
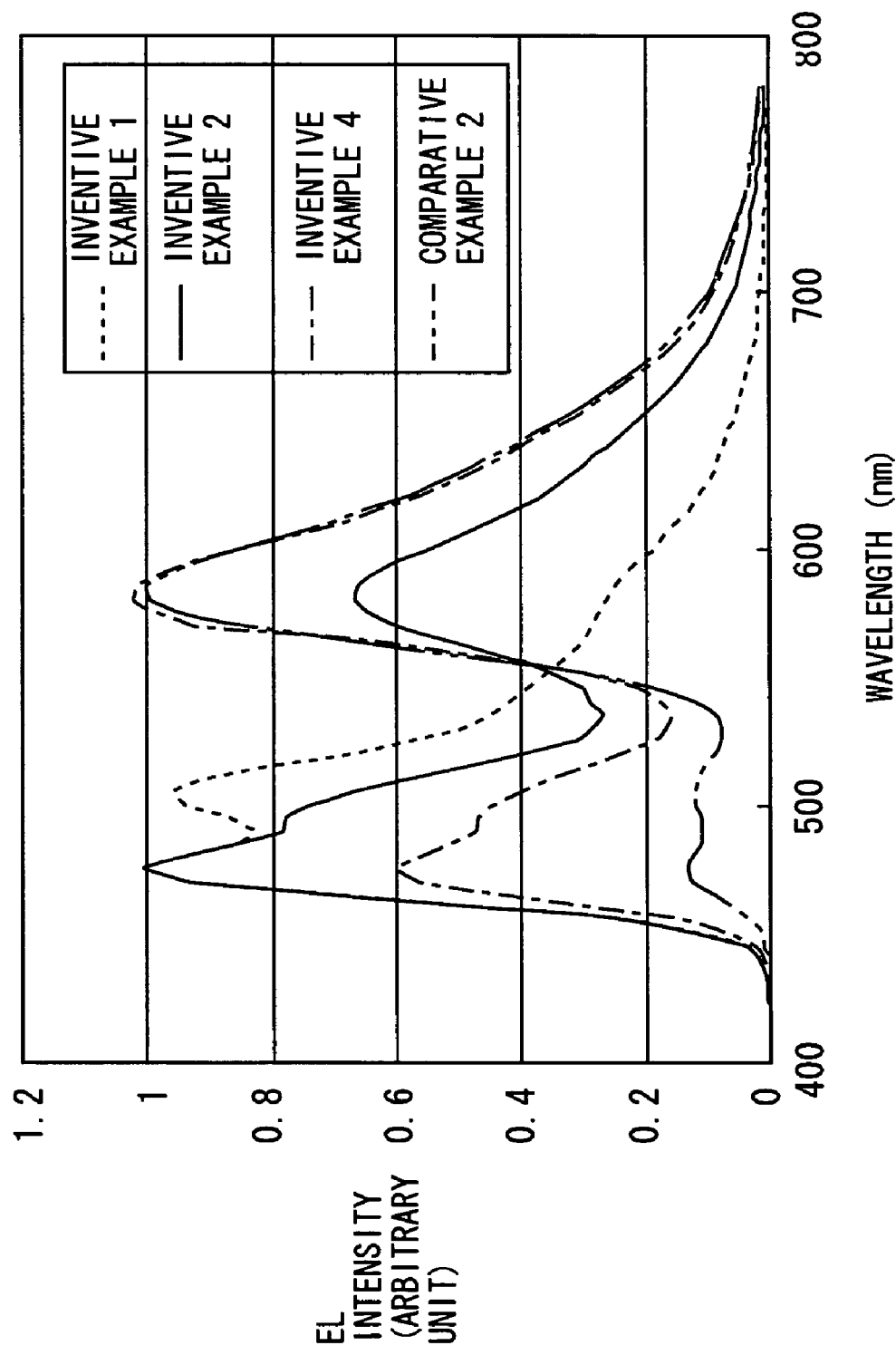
FIG. 5 is a diagram showing the spectrum of the intensity of light emitted by each of organic EL devices produced in examples 1, 2, and 4 and a comparative example 2.

FIG. 5 is a diagram showing the spectrum of the intensity of light emitted by each of the organic EL devices prepared in the inventive examples 1, 2, and 4 and the comparative example 2. In FIG. 5, the ordinate axis represents the intensity of light, and the abscissa axis represents the wavelength of light.

As shown in FIG. 5, in the organic EL device prepared in the inventive example 1, the blue light has a high peak in intensity, while the orange light hardly has a peak in intensity. By comparison, in the organic EL device prepared in the inventive example 2, both the blue light and the orange light respectively have high peaks. This shows that the organic EL device in the inventive example 2 can efficiently emit white light.

In the organic EL device prepared in the comparative example 2, the orange light has a high peak in intensity, while the blue light hardly has a peak in intensity. By comparison, in the organic EL device prepared in the inventive example 4, both the blue light and the orange light respectively have high peaks. This shows that the organic EL device in the inventive example 4 can efficiently emit white light.

Inventive Example 7

In the inventive example 7, the organic EL device was prepared in the same method as that in the inventive example 2 except that the volume ratio of NPB to the blue light emitting layer 5 was changed from 0% to 50%.

(Evaluation 2)

Figure 6:
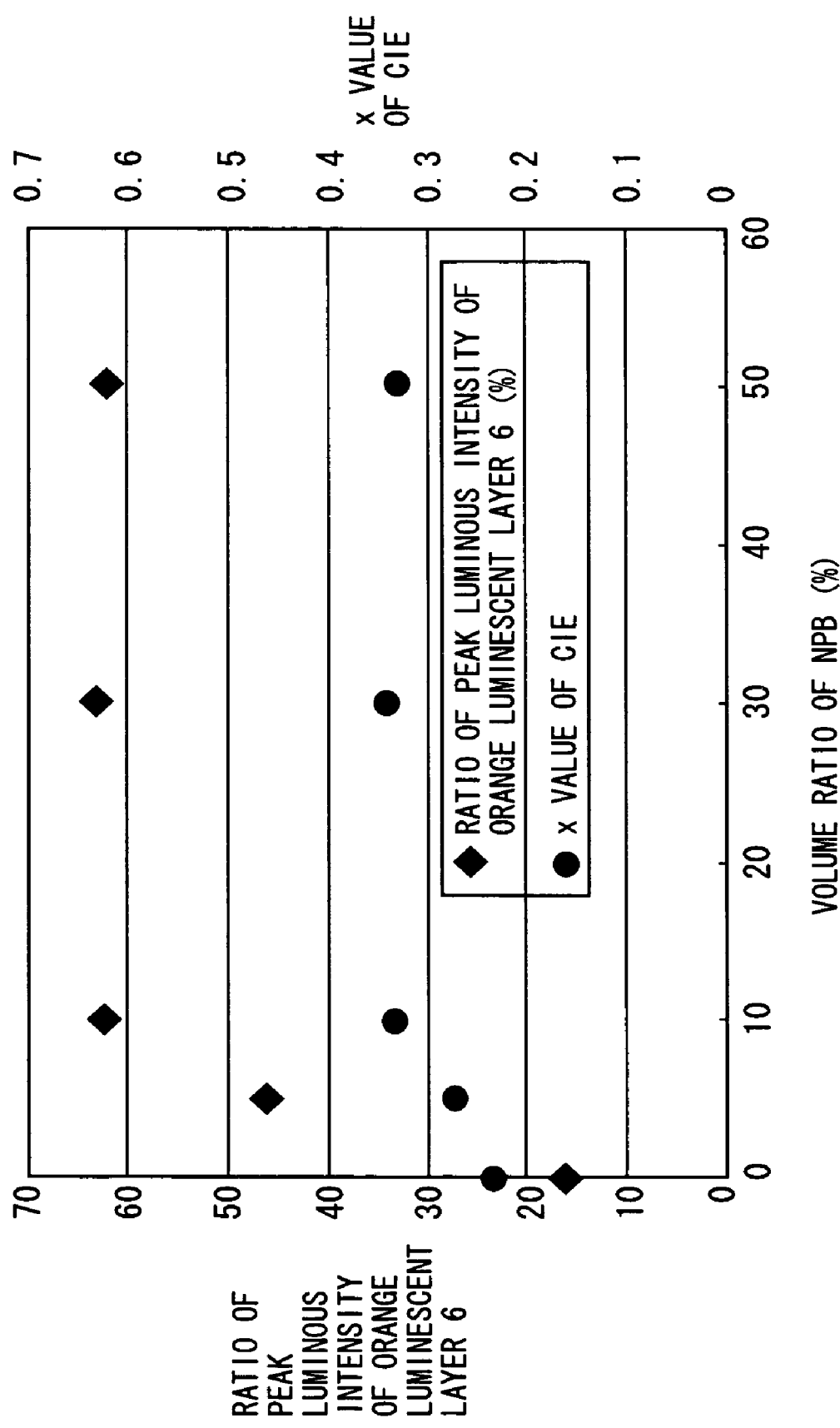
FIG. 6 is a diagram showing the results of measurement of the relationship among the concentration of doped NPB, the peak luminous intensity of an orange light emitting layer, and the luminescent color (the x value of CIE)

The luminescent properties of the organic EL device prepared in the inventive example 7 were measured. FIG. 6 is a diagram showing the results of measurement of the relationship among the concentration of doped NPB, the peak luminous intensity of the orange light emitting layer 6, and the luminescent color (the x value of CIE (International Commission on Illumination)). In FIG. 6, the ordinate axis represents the ratio of the peak luminous intensity of the orange light emitting layer 6 in a case where the peak luminous intensity of the blue light emitting layer 5 was taken as 100 and the x value of CIE, and the abscissa axis represents the concentration of NPB doped into the blue light emitting layer 5.

As shown in FIG. 6, when the volume ratio of NPB exceeded 10%, the ratio of the peak intensity of the orange light emitting layer 6 was high.

Inventive Example 8

In the inventive example 8, the organic EL device was prepared in the same method as that in the inventive example 4 except that the volume ratio of NPB to the orange light emitting layer 6a was changed from 0% to 50%.

(Evaluation 3)

Figure 7:
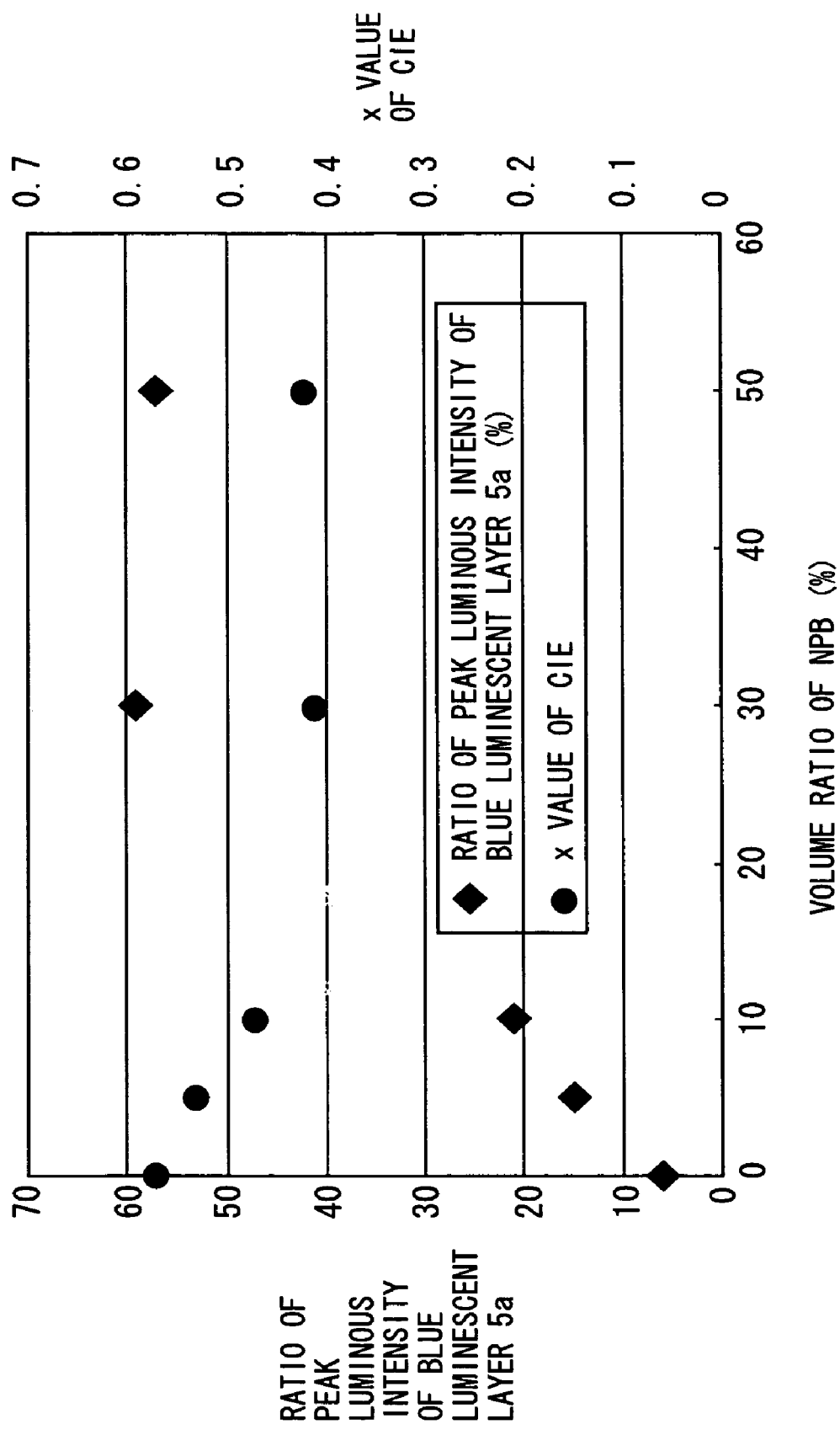
FIG. 7 is a diagram showing the results of measurement of the relationship among the concentration of doped NPB, the peak luminous intensity of a blue light emitting layer, and the luminescent color (the x value of CIE)

The luminescent properties of the organic EL device prepared in the inventive example 8 were measured. FIG. 7 is a diagram showing the results of measurement of the relationship among the concentration of doped NPB, the peak luminous intensity of the blue light emitting layer 5a, and the luminescent color (the x value of CIE).

In FIG. 7, the ordinate axis represents the ratio of the peak luminous intensity of the blue light emitting layer 5a in a case where the peak luminous intensity of the orange light emitting layer 6a was taken as 100 and the x value of CIE, and the abscissa axis represents the concentration of NPB doped into the orange light emitting layer 6a.

As shown in FIG. 7, when the volume ratio of NPB exceeded 10%, the ratio of the peak intensity of the blue light emitting layer 5a was high.

Inventive Example 9

In the inventive example 9, the organic EL device was prepared in the same method as that in the inventive example 4 except that the assisting dopant composed of NPB was not doped into the orange light emitting layer 6a, and CBP was doped into the blue light emitting layer 5a as the assisting dopant, and CBP was doped such that the volume ratio thereof to the blue light emitting layer 5a was 10%.

Inventive Example 10

In the inventive example 10, the organic EL device was prepared in the same method as that in the inventive example 4 except that CBP was doped into the blue light emitting layer 5a as the assisting dopant, and CBP was doped such that the volume ratio thereof to the blue light emitting layer 5a was 10%.

Comparative Example 3

In the comparative example 3, the organic EL device was prepared in the same method as that in the inventive example 9 except that NBP was doped into the blue light emitting layer 5a as the assisting dopant instead of doping CBP into the blue light emitting layer 5a as the assisting dopant, and NBP was doped such that the volume ratio thereof to the blue light emitting layer 5a was 10%.

Inventive Example 11

In the inventive example 11, the organic EL device was prepared in the same method as that in the inventive example 1 except that CBP was doped into the blue light emitting layer 5 as the assisting dopant, and Ir(Naphq) and Ir(phq) were respectively doped into the orange light emitting layer 6 as the luminescent dopant and the assisting dopant, CBP was doped such that the volume ratio thereof to the blue light emitting layer 5 was 10%, and Ir(Naphq) and Ir(phq) were doped such that the volume ratios thereof to the orange light emitting layer 6 were respectively 1% and 9%.

Comparative Example 4

In the comparative example 4, the organic EL device was prepared in the same method as that in the inventive example 11 except that no assisting dopant was doped into the blue light emitting layer 5.

(Evaluation 4)

The luminescent properties of each of the organic EL devices prepared in the inventive examples 9 to 11 and the comparative examples 3 and 4 were measured. Table 2 shows the structure, a material for each of layers, and the results of measurement of the luminescent properties of each of the organic EL devices prepared in the inventive examples 9 to 11 and the comparative examples 3 and 4.

The reason for this is conceivably that the same material as the host material composing the orange light emitting layer 6a was doped into the blue light emitting layer 5a as the assisting dopant, so that the HOMO level of the host material composing the orange light emitting layer 6a and the HOMO level of the assisting dopant in the blue light emitting layer 5a are the same energy level, thereby increasing the amount of injection of holes into the blue light emitting layer 5a.

In the inventive example 10, NPB was doped into the orange light emitting layer 6a, thereby obtaining best balanced white light.

In the organic EL device prepared in the inventive example 11, the luminous efficiency thereof was improved, and a drive voltage was reduced, as compared with those in the organic EL device in the comparative example 4. The reason for this is conceivably that the same material as the host material composing the orange light emitting layer 6 was doped into the blue light emitting layer 5 as the assisting dopant, so that the LUMO level of the host material composing the orange light emitting layer 6 and the LUMO level of the assisting dopant in the blue light emitting layer 5 are the same energy level, thereby increasing the amount of injection of electrons into the blue light emitting layer 5. CBP is a bipolar material having hole transport properties and electron transport properties.

Furthermore, in the inventive example 11, Ir(phq) was doped into the orange light emitting layer 6a as the assisting dopant, thereby obtaining well balanced white light.

Inventive Example 12

In the inventive example 12, the organic EL device having the structure A was prepared in the same method as that in the inventive example 1 except for the following. That is, CBP was used as a host material composing the blue light emitting layer 5, and FIrpic which is a phosphorescent material was used as the luminescent dopant. FIrpic was doped such that the volume ratio thereof to the blue light emitting layer 5 was 6.5%.

Furthermore, CBP was used as a host material composing the orange light emitting layer 6, Ir(phq) which is a phospho-

TABLE 2

| | device structure | blue luminescent layer host material/ luminescent dopant | blue luminescent layer assisting dopant | orange luminescent layer host material/ luminescent dopant | orange luminescent layer assisting dopant | luminescent color (CIE x, y) | luminous efficiency (cd/A at 10 mA/cm$^2$) | ratio of peak luminous intensities of blue luminescent layer/orange luminescent layer | drive voltage (V at 10 mA/cm$^2$) |
|---|---|---|---|---|---|---|---|---|---|
| inventive example 9 | B | compound A/ TBP | CBP10% | CBP/ Ir(phq)6.5% | no | 0.42, 0.41 | 34.8 | 58/100 | 8 |
| inventive example 10 | B | compound A/ TBP | CBP10% | CBP/ Ir(phq)6.5% | NPB10% | 0.32, 0.37 | 24.2 | 100/42 | 7.8 |
| comparative example 3 | B | compound A/ TBP | NBP10% | CBP/ Ir(phq)6.5% | no | 0.50, 0.43 | 21.6 | 65/100 | 8.2 |
| inventive example 11 | A | compound A/ TBP | CBP10% | CBP/ Ir(Naphq)1% | Ir(phq)9% | 0.36, 0.37 | 18.5 | 100/67 | 8.9 |
| comparative example 4 | A | compound A/ TBP | no | CBP/ Ir(Naphq)1% | Ir(phq)9% | 0.21, 0.37 | 12.8 | 100/24 | 9.2 |

In each of the organic EL devices prepared in the inventive examples 9 to 10, the luminous efficiency thereof was improved, and a drive voltage was reduced, as compared with those in the organic EL device in the comparative example 3.

rescent material was used as the luminescent dopant, and Ir(ppy) was used as the assisting dopant. Ir(phq) and Ir(ppy) were doped such that the volume ratios thereof to the orange light emitting layer 6 were respectively 1% and 6.5%.

Inventive Example 13

In the inventive example 12, the organic EL device having the structure B was prepared in the same method as that in the inventive example 4 except for the following. That is, CBP was used as a host material composing the blue light emitting layer 5a, and FIrpic which is a phosphorescent material was used as the luminescent dopant. FIrpic was doped such that the volume ratio thereof to the blue light emitting layer 5 was 6.5%.

CBP was used as a host material composing the orange light emitting layer 6a, Ir(phq) which is a phosphorescent material was used as the luminescent dopant, and Ir(ppy) was used as the assisting dopant. Ir(phq) and Ir(ppy) were doped such that the volume ratios thereof to the orange light emitting layer 6 were respectively 1% and 6.5%.

(Evaluation 5)

The luminescent properties of each of the organic EL devices prepared in the inventive examples 13 and 14 were measured. Table 3 shows the structure, a material for each of layers, and the results of measurement of the luminescent properties of each of the organic EL devices prepared in the inventive examples 13 to 14.

TABLE 3

|  | device structure | blue luminescent layer host material/ luminescent dopant | blue luminescent layer assisting dopant | orange luminescent layer host material/ luminescent dopant | orange luminescent layer assisting dopant | luminescent color (CIE x, y) | luminous efficiency (cd/A at 10 mA/cm$^2$) | ratio of peak luminous intensities of blue luminescent layer/orange luminescent layer | drive voltage (V at 10 mA/ cm$^2$) |
|---|---|---|---|---|---|---|---|---|---|
| inventive example 12 | A | CBP/ Firpic 6.5% | no | CBP/ Ir(phq) 1% | Ir(ppy) 6.5% | 0.41, 0.47 | 24 | 64/100 | 9.3 |
| inventive example 13 | B | CBP/ Firpic 6.5% | no | CBP/ Ir(phq) 1% | Ir(ppy) 6.5% | 0.53, 0.42 | 27 | 20/100 | 9.1 |

In each of the organic EL devices prepared in the inventive examples 12 to 13, a phosphorescent material was used as the luminescent dopant for both the blue light emitting layers 5 and 5a and the orange light emitting layers 6 and 6a, thereby significantly improving the luminous efficiency thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent device comprising in the following order:
   a first electrode;
   a light emitting layer; and
   a second electrode,
   said light emitting layer containing two or more different luminescent materials, and at least one of said two or more different luminescent materials being a phosphorescent material, wherein
   said at least one phosphorescent material includes a Tris (2-phenylquinoline)iridium, a derivative of said Tris(2-phenylquinoline)iridium or an iridium complex,
   said light emitting layer comprises a short wavelength light emitting layer and a long wavelength light emitting layer,
   at least one of the peak wavelengths of light emitted by said short wavelength light emitting layer being in a range of 430 nm to 520 nm, and at least one of the peak wavelengths of light emitted by said long wavelength light emitting layer being in a range of 520 nm to 630 nm,
   said long wavelength light emitting layer includes a first host material and a first phosphorescent material,
   said first electrode is an anode, and said second electrode is a cathode,
   said long wavelength light emitting layer and said short wavelength light emitting layer are formed in this order between said anode and said cathode,
   said short wavelength light emitting layer further contains a second host material and an assisting dopant, and
   said assisting dopant is composed of the same material as said first host material and said assisting dopant is an anthracene derivative or an iridium complex.

2. The organic electroluminescent device according to claim 1, wherein
   said short wavelength light emitting layer contains a second phosphorescent material.

3. An organic electroluminescent device comprising in the following order:
   a first electrode;
   a light emitting layer; and
   a second electrode,
   said light emitting layer containing two or more different luminescent materials, and at least one of said two or more different luminescent materials being a phosphorescent material, wherein
   said at least one phosphorescent material includes a Tris (2-phenylquinoline)iridium, a derivative of said Tris(2-phenylquinoline)iridium or an iridium complex,
   said light emitting layer comprises a short wavelength light emitting layer and a long wavelength light emitting layer,
   at least one of the peak wavelengths of light emitted by said short wavelength light emitting layer being in a range of 430 nm to 520 nm, and at least one of the peak wavelengths of light emitted by said long wavelength light emitting layer being in a range of 520 nm to 630 nm, said long wavelength light emitting layer includes a first host material and a first phosphorescent material, said short wavelength light emitting layer contains a second host material and a second phosphorescent material, said first electrode is an anode, and said second electrode is a cathode, said short wavelength light emitting layer and said long wavelength light emitting layer are formed in this order between said anode and said cathode, said short wavelength light emitting layer further contains an assisting dopant, and said assisting dopant is composed of the same material as said first host material and is an anthracene derivative or an iridium complex.

4. An organic electroluminescent device comprising in the following order:

a first electrode;

a light emitting layer; and a second electrode, said light emitting layer containing two or more different luminescent materials, and at least one of said two or more different luminescent materials being a phosphorescent material, wherein:

said at least one phosphorescent material includes a Tris(2-phenylquinoline)iridium, a derivative of said Tris(2-phenylquinoline)iridium or an iridium complex, said light emitting layer comprises a short wavelength light emitting layer and a long wavelength light emitting layer, at least one of the peak wavelengths of light emitted by said short wavelength light emitting layer being in a range of 430 nm to 520 nm, and at least one of the peak wavelengths of light emitted by said long wavelength light emitting layer being in a range of 520 nm to 630 nm, said long wavelength light emitting layer includes a first host material and a first phosphorescent material, said first electrode is an anode, and said second electrode is a cathode, said long wavelength light emitting layer and said short wavelength light emitting layer are formed in this order between said anode and said cathode, said long wavelength light emitting layer further contains a first assisting dopant having a hole transport capability and said first assisting dopant is an anthracene derivative or an iridium complex, said long wavelength light emitting layer contains a first host material and a first phosphorescent material, said short wavelength light emitting layer contains a second host material, a second phosphorescent material, and a second assisting dopant, and said second assisting dopant is composed of the same material as said first host material.

* * * * *